United States Patent [19]

Aoyagi et al.

[11] Patent Number: 5,185,287
[45] Date of Patent: Feb. 9, 1993

[54] METHOD FOR PRODUCING A QUANTUM WELL STRUCTURE

[75] Inventors: Toshitaka Aoyagi; Kimio Shigihara, both of Itami, Japan

[73] Assignee: Mitsubishi Denki Kabushiki Kaisha, Tokyo, Japan

[21] Appl. No.: 641,268

[22] Filed: Jan. 15, 1991

[30] Foreign Application Priority Data

Feb. 22, 1990 [JP] Japan .................................. 2-43090

[51] Int. Cl.$^5$ ......................................... H01L 21/203
[52] U.S. Cl. ................................. 437/105; 437/107; 437/113
[58] Field of Search .............. 437/105, 107, 113; 148/DIG. 45; 118/723

[56] References Cited

U.S. PATENT DOCUMENTS

| | | | |
|---|---|---|---|
| 4,805,555 | 2/1989 | Itoh | 118/723 |
| 4,806,502 | 2/1989 | Jorke et al. | 437/105 |
| 4,811,690 | 3/1989 | Kawagoe et al. | 118/723 |
| 4,883,770 | 11/1989 | Dohler et al. | 437/105 |

FOREIGN PATENT DOCUMENTS 60-91625   5/1985 Japan .
61-270814 12/1986 Japan .
62-27563   2/1987 Japan .
62-188774  8/1987 Japan .
62-244122 10/1987 Japan .

OTHER PUBLICATIONS

"The Technical Report of Mitsubishi Denki Kabushiki Kaisha", vol. 60, No. 5, 1986, pp. 53-57.

*Primary Examiner*—Brian E. Hearn
*Assistant Examiner*—C. Chaudhari
*Attorney, Agent, or Firm*—Leydig, Voit & Mayer

[57] ABSTRACT

A method for producing a box type quantum well structure includes generating ion clusters, linearly accelerating the clusters with an electric field, passing the accelerated cluster ions through a further field perpendicular to the accelerating direction, causing the cluster ions to follow different ion orbits in accordance with the number of constituent atoms of the respective cluster ions, intercepting the cluster ions having a predetermined number of atoms with a substrate arranged in the orbit of the cluster ions having a predetermined number of atoms. A neutral particle shielding plate is provided along a straight line between the substrate and the cluster ion source to prevent neutral particles from flowing toward the substrate. Thereby, GaAs boxes having the same size can be obtained and variations in the quantum effects of the boxes can be reduced.

10 Claims, 4 Drawing Sheets

METHOD FOR PRODUCING A QUANTUM WELL STRUCTURE

FIELD OF THE INVENTION

The present invention relates to a method for producing a quantum well structure. More particularly, the invention relates to a quantum well structure production method that can reduce variations in the box size of a box type quantum well structure.

BACKGROUND OF THE INVENTION

FIG. 3 shows a production method of a prior art box type quantum well structure. In FIG. 3, an ion cluster 6 including several tens of atoms, an ion cluster 7 including one to two hundred atoms and an ion cluster 8 including more than two hundred atoms are generated in a Ga ion cluster source 1. An acceleration electric field 3 is applied to the cluster ions by a grid for generating an acceleration electric field 2. Reference numeral 4 designates a GaAs substrate and an AlGaAs layer 5 is deposited thereon. Arsenic molecules 10 are supplied by an arsenic molecular beam source 9.

The operation and functions will be described hereinafter.

A plurality of clusters including several tens to several hundreds of Ga atoms are generated in the Ga cluster ion source 1, and each cluster is given monovalent positive charge equally and becomes a cluster ion. These ion clusters, that is, a cluster 6 including several tens of atoms, a cluster 7 including one to two hundred atoms and a cluster 8 including more than two hundred atoms emerge from the Ga cluster ion source 1, and thereafter an acceleration electric field 3 is applied thereto by the grid for an acceleration electric field 2. Then, the cluster ions are accelerated in the direction toward the GaAs substrate 4 on which the AlGaAs layer 5 is deposited and attach to the surface thereof. Meanwhile since the arsenic molecular beam source 9 continuously gives excessive arsenic molecules 10 to the substrate, constituent atoms of a Ga cluster which has attached onto the surface of the AlGaAs layer 5 are rearranged to be a GaAs box of a size in accordance with the number of Ga atoms, and as a result the GaAs box functions as a quantum well structure.

Since the prior art production method a box type quantum well structure is constituted as described above, several tens to several hundred Ga ion clusters are attached to the surface of the AlGaAs layer 5 at random. As a result, the GaAs box which functions as a quantum well is irregular in size and in quantum effect.

FIG. 4 shows a prior art cluster ion beam film forming device which has a function of selecting clusters in accordance with whether the number of constituent atoms is large or small, described in Japanese published Patent Application 62-27563. In FIG. 4, reference numeral 21 designates a bell jar. A cluster ion gun 23 which emits an ion beam 22, an accelerating electrode 24 for accelerating the ion beam 22 provided confronting to the cluster ion gun 23, a substrate holder 26 for holding a substrate 25, and a shutter 27 for cutting off the ion beam 22 are arranged in the bell jar 21. An electromagnet 28 for producing a magnetic field in the z direction of the figure is provided. A direct current power supply 29 for accelerating the ion beam 22 is connected with the accelerating electrode 24. Reference numeral 30 designates a quartz oscillator film thickness sensor.

The device will operate as follows.

The ion beam 22 emitted from the cluster ion gun 23 is accelerated toward the substrate 25 by the accelerating electric field which is generated by the accelerating electrode 24, and at the same time, the ion beam 22 is deflected by the magnetic field in the z direction which is produced by the electromagnet 28. Here, the extent that the ion beam 22 is deflected by the magnetic field increases as the number of constituent atoms of cluster becomes smaller. Accordingly, clusters including a large number of atoms attach to the substrate 25 without being deflected while the clusters including a small number of atoms are greatly deflected and do not attach to the substrate 25. In this way, this prior art device enables selection of the size of clusters which attach to the substrate. However, even when a box type quantum well structure is produced when the size of the cluster which attaches to the substrate is selected utilizing the above-described principle, only clusters having a small number of atoms are removed, and it is still impossible to obtain the same size of boxes so that the quantum effect does not vary. Furthermore, although the ionized clusters are selected in this method, the neutral particles which are not deflected by the magnetic field cannot be selected and clusters having a small number of atoms cannot be sufficiently selected.

SUMMARY OF THE INVENTION

The present invention is directed to solving the above-described problems and has for its object to provide a method for producing a box type quantum well structure without variations in the size of GaAs box and in the quantum effect.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, a method for producing a quantum well structure comprises linearly accelerating one or more clusters generated and ionized with a cluster ion source by a electric field, passing the accelerated cluster ions through a further field to apply a force, the direction of which is perpendicular to the accelerating direction, and which causes the respective cluster ions to follow different orbits in accordance with the number of constituent atoms of the cluster ions, arranging the substrate stage on which the substrate crystal is placed in the orbit of cluster ions having a predetermined number of atoms such that the surface of the stage has a proper angle with the orbit, and attaching the cluster ions having a predetermined number of atoms to the substrate crystal. Therefore, GaAs boxes having the same size can be obtained, and variations in quantum effect can be reduced.

According to a second aspect of the present invention, a method for producing a quantum well structure comprises linearly accelerating one or more clusters which are generated and ionized in a cluster ion source with an electric field, passing the accelerated cluster ions through a further field to apply a force, the direction of which is perpendicular to the accelerating direction, and which causes the respective cluster ions to follow different ion orbits in accordance with the number of constituent atoms of the cluster ions, arranging the substrate stage on which the substrate crystal is disposed in the orbit of cluster ions having a predetermined number of atoms, providing a neutral particle shielding plate along a straight line from the cluster ion source to the substrate stage to prevent neutral particles from flowing toward the substrate stage, and attaching cluster ions having the predetermined number of atoms to the substrate crystal. Therefore, the variations in GaAs box size due to the neutral particles and variations in the quantum effect can be reduced.

DETAILED DESCRIPTION OF THE PREFERRED EMBODIMENT

An embodiment of the present invention will be described in detail with reference to the drawings.

Figure 1:
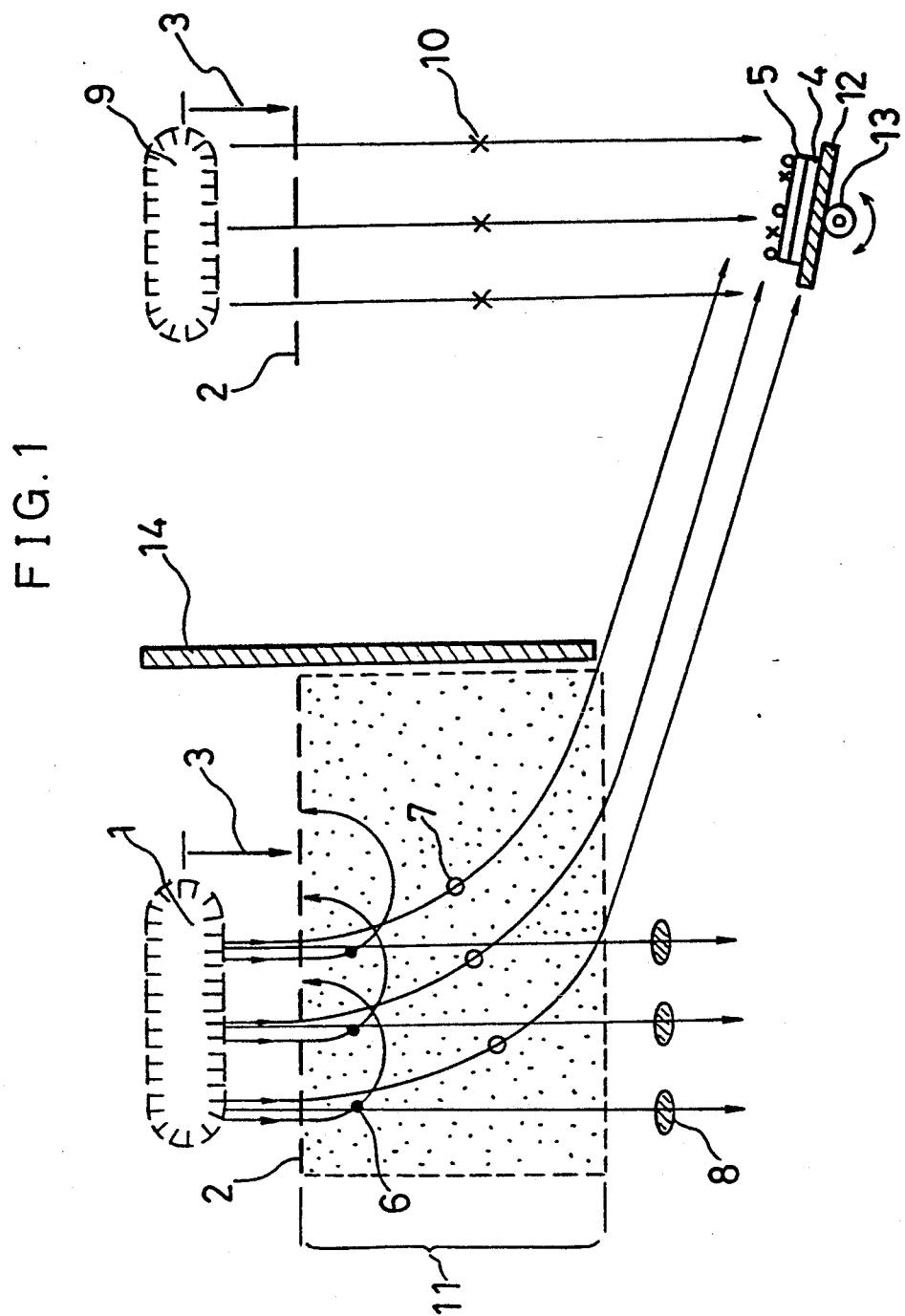
FIG. 1 is a diagram showing a method for producing a quantum well structure according to an embodiment of the present invention.

FIG. 1 is a diagram showing a method for producing a quantum well structure according to an embodiment of the present invention. In FIG. 1, cluster ions are generated in a Ga cluster ion source 1, and an acceleration electric field 3 is applied thereto by a grid for generating an acceleration electric field 2. A GaAs substrate 4 having an AlGaAs layer 5 thereon is set on a substrate holder 12 with a substrate holder rotating axis 13. An ion cluster 6 has several tens of atoms, an ion cluster 7 has one to two hundred atoms, and an ion cluster 8 has more than two hundreds atoms. An arsenic ion cluster 10 is generated in an arsenic cluster ion source 9. A magnetic field 11 has a direction perpendicular to the accelerating direction of a cluster ion. Reference numeral 14 designates a neutral particle shielding plate.

The operation and functions will be described.

A plurality of cluster ions having several tens to hundreds of Ga atoms are generated in the Ga cluster ion source 1, and given a positive electric charge equally to become cluster ions 6, 7, and 8. The acceleration electric field 3 is applied to the cluster ions by the grid for generating an acceleration electric field 2 to accelerate the clusters toward a predetermined direction. Thereafter, the cluster ions 6, 7, and 8 enter the magnetic field 11, the direction of which is perpendicular to the accelerating direction. The respective cluster ions receive forces from the magnetic field in accordance with the number of Ga atoms included in respective ions, and traverse part of one of a plurality of circular orbits which have different radii, respectively. For example, in FIG. 1, when an orthogonal magnetic field 11, which is directed vertically to the paper surface toward the rear surface of the paper is applied to the cluster ions, the cluster ions 6, 7, and 8 are affected by forces so as to produce an anti-clockwise circular orbit in the orthogonal magnetic field 11, and the radius of the circular orbit traversed is smaller as the mass of cluster ion, that is, the number of Ga atoms, is smaller. In addition, the radius of the circular orbit depends on the mass (number of atoms) of ion cluster as can be clearly seen from the following formula:

$$r = \frac{1}{B}\sqrt{\frac{2mhE}{e}}$$

where r is the radius of the circular orbit, e is the elementary charge, m the cluster mass, B the magnetic flux density, E the electric field strength, and h is the distance traveled due to the electric field.

As a result, a cluster ion having a large mass, for example, a cluster ion 8 having more than two hundred atoms passes almost linearly through the orthogonal magnetic field 11 while a cluster ion having a small mass, for example, cluster ion 6 having several tens of atoms produces an orbit which has a large curve in the orthogonal magnetic field 11. A cluster ion having a medium mass, for example, a cluster ion 7 having one to two hundred atoms produces an orbit which curves in a medium extent in the orthogonal magnetic field 11. Thereafter, the cluster ions 6, 7, and 8 come out from the orthogonal magnetic field 11 and continue moving rectilinearly, in different directions in accordance with their mass, respectively, as is apparent from the above explanation. Accordingly, as they leave the orthogonal magnetic field 11, the cluster ions having different masses produce respective orbits which are more widely spaced from each other while the cluster ions having closer masses produce orbits which are closer to each other.

In a case where only ion clusters having one to two hundred atoms is utilized and the GaAs substrate 4 having the AlGaAs layer 5 thereon is provided on the orbit of the cluster ion 7 having one to two hundred atoms as shown in FIG. 1, only the cluster ion having one to two hundred atoms 7 attach to the surface of the AlGaAs layer 5. Arsenic atoms in accordance with the number of Ga atoms in the attached Ga clusters are supplied from the arsenic cluster ions 10 which are generated in the arsenic cluster ion source 9 and are accelerated by the acceleration electric field. The Ga and As atoms combine to become GaAs having one to two hundred Ga atoms, thereby producing box type quantum well structures having the same size on the surface of the AlGaAs layer 5. In this embodiment, the above-described substrate holder 12 can rotate freely around the shaft 13. Therefore, the substrate stage can be adjusted so that its placing surface confronts to the orbit of cluster ions having the predetermined number of atoms with a precise angle appropriate for attaching clusters having the same size, and then the selection of cluster ions which attach to the surface of substrate crystal can be achieved with high precision.

Here, when the substrate holder is provided not parallel but at a certain angle to the orbit of the cluster ion having a plurality of atoms, the ends thereof may confront the orbits of cluster ions having different number of atoms. Therefore, the substrate holder should be placed such that it does not confront the orbits of cluster ions having different number of atoms. The above-described substrate holder can be made movable toward the Y direction in FIG. 1. A plurality of holders may be used in order to obtain various GaAs boxes using Ga cluster ions having different numbers of atoms. Also the different GaAs boxes can be obtained by changing the orbits of the Ga cluster ions by varying the intensity of the orthogonal magnetic field.

The function will be described of the neutral particle shielding plate 14.

Figure 2:
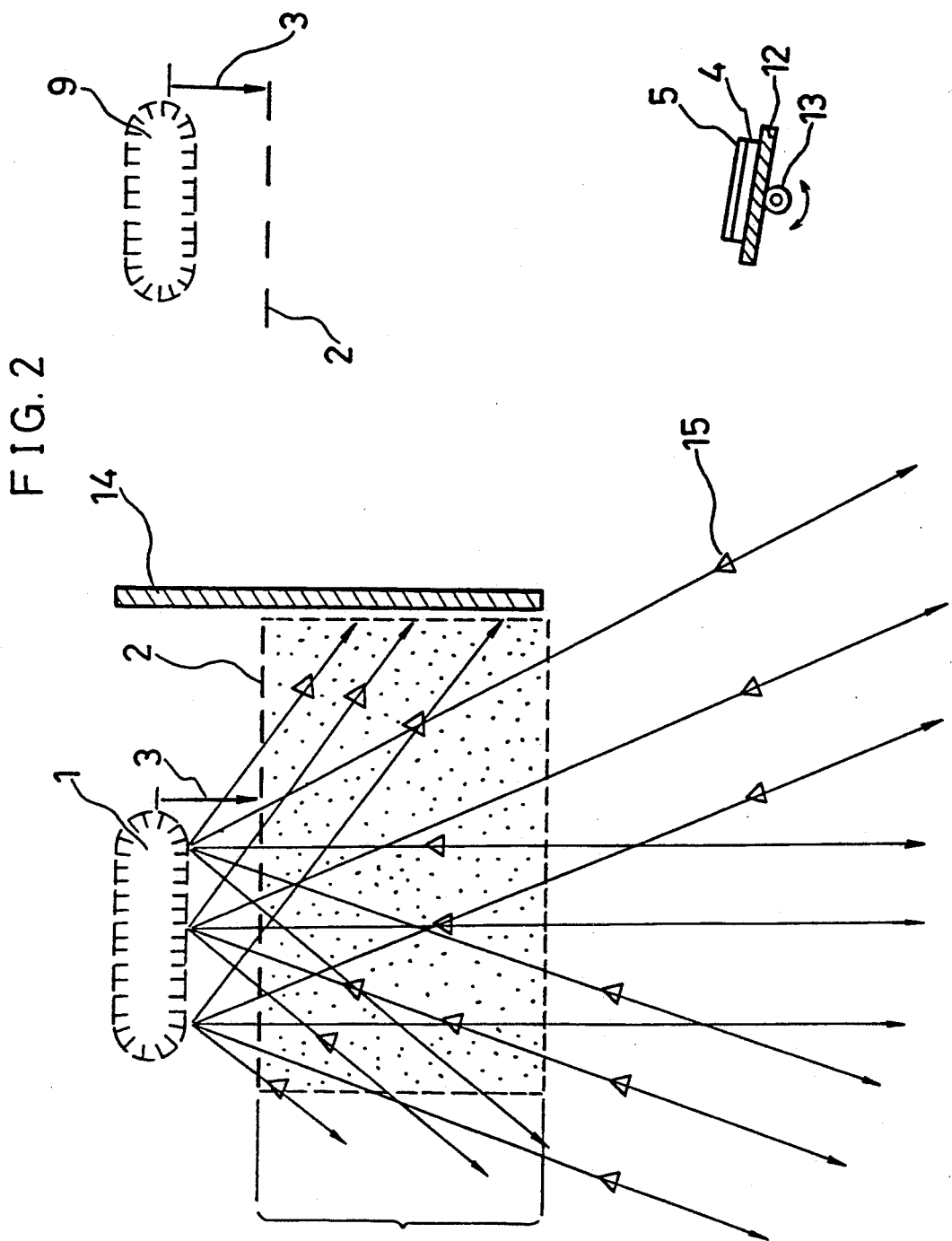
FIG. 2 is a diagram for explaining the function of a neutral particle shielding plate.
Figure 3:
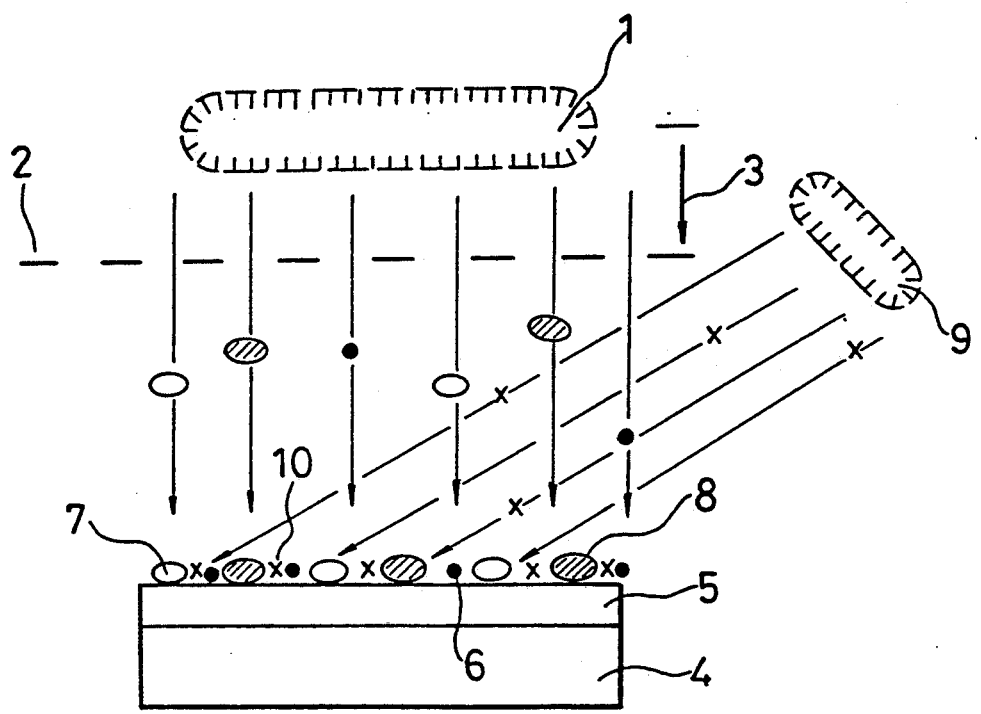
FIG. 3 is a diagram showing a conventional method for producing a quantum well structure.
Figure 4:
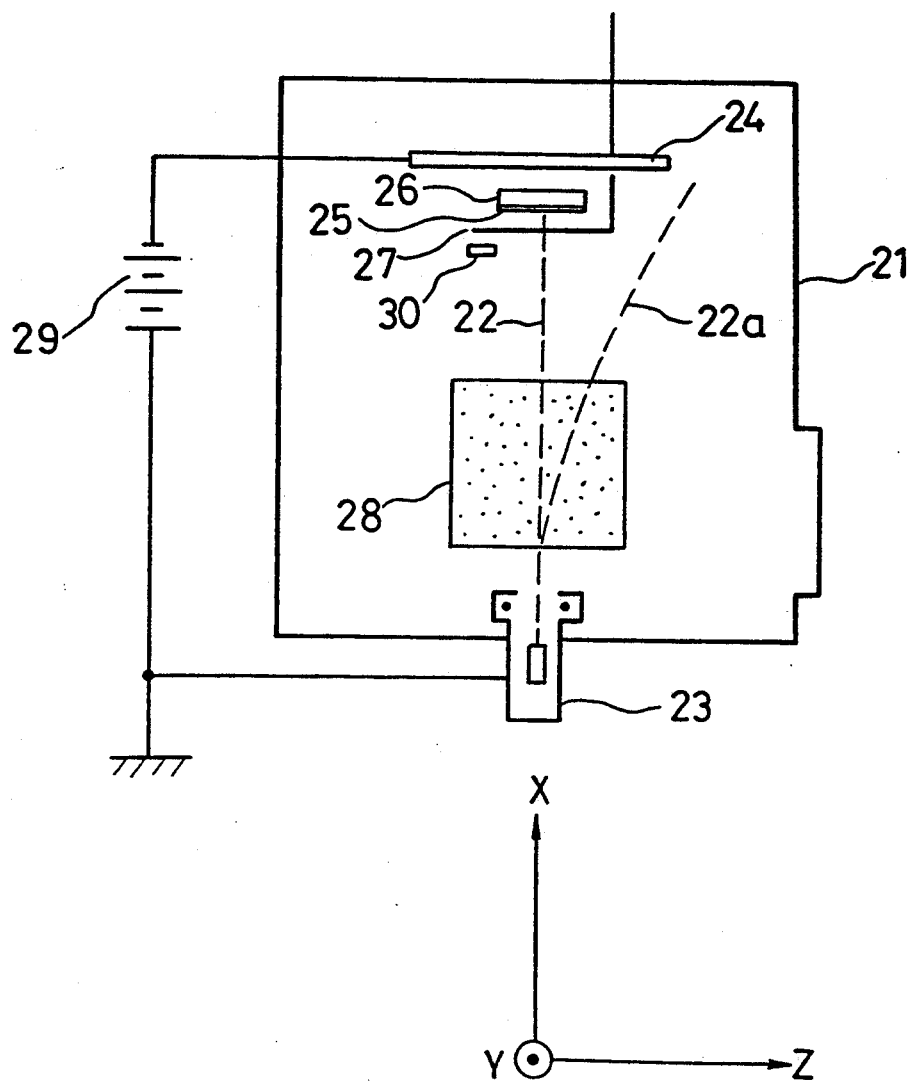
FIG. 4 is a diagram showing a conventional cluster ion beam film forming device which selects clusters depending on the number of constituent atoms of the clusters.

FIG. 2 is a diagram for explaining the function of the neutral particle shielding plate 14. In FIG. 2, the same reference numerals as those shown in FIG. 1 designate the same portions. Reference numeral 15 designates a non-ionized neutral particle generated in the cluster ion source 1. As shown in FIG. 2, a lot of neutral particles 15 which are non-ionized clusters are generated in the cluster ion source 1 as well as the cluster ions of FIG. 1. The number of Ga atoms which compose the neutral particle clusters ranges from several tens to several hundreds similarly as in the case of cluster ions shown in FIG. 1. When such neutral particles having different number of atoms attach to the substrate at random, variations arise in the GaAs box size, resulting in a deterioration in property similarly as in the case of cluster ions.

In this embodiment, the neutral particle shielding plate 14 is provided to prevent the neutral particles 15 from attaching to the substrate. Since the neutral particles 15 have no charge, they are not deflected by the orthogonal magnetic field 11. Accordingly, when the cluster ion source 1, the neutral particle shielding plate 14 and the substrate holder 12 are arranged such that a cluster generated from the cluster ion source 1 cannot reach the substrate because the neutral particle shielding plate 14 obstructs the cluster unless the cluster is deflected by the magnetic field to produce a curved orbit, and it is possible to prevent neutral particles 15 from attaching to the substrate.

In this embodiment, since the neutral particle shielding plate 14 is provided to prevent the neutral particles 15 from attaching to the substrate in the above-described positional relationship, it is possible to avoid variations in GaAs box size caused by neutral particles 15 having different numbers of atoms attaching to the substrate at random.

In the above described-embodiment, AlGaAs and GaAs are used to constitute a quantum well structure, but other combination of materials such as combinations of III-V group, II-VI group, or IV group compounds can be used to constitute a quantum well structure.

Furthermore, in the above-described embodiment, ionized arsenic molecules (or clusters) are used for supplying the arsenic, but an arsenic molecular beam which is electrically neutral can be used with the same effect as described above.

Furthermore, in the above-described embodiment, an orthogonal magnetic field is used as a field which changes an orbit of cluster ions in accordance with the number of atoms included in respective cluster ions, but an electric field can be used with the same effect.

While in the above-illustrated embodiment an example in which a GaAs box is produced on AlGaAs is shown, the present invention can be applied to a production of a GaAs box in a case where a box type quantum well structure is produced by producing a GaAs box on AlGaAs and further growing AlGaAs thereon.

Furthermore, in the above-described embodiment, a method of producing a quantum well structure having the same size and having no variation in the quantum effect is shown. However, in epitaxy using the normal cluster ion beam method, selection of the cluster ions having similar masses enables epitaxy by only using the cluster ions having uniform kinetic energy.

As is evident from the foregoing description, according to the present invention, the orbit of cluster ions is changed in accordance with the number of atoms included in respective cluster ions by an orthogonal magnetic field, and the substrate stage on which a substrate crystal is disposed is arranged on the orbit of cluster ions having a predetermined number of atoms, and at a proper angle with the orbit, and the above-described cluster ions having a predetermined number of atoms are attached to the substrate crystal. Therefore, GaAs boxes having the same size can be obtained, thereby resulting in reduction in variations in the quantum effect.

In addition, according to the present invention, a neutral particle shielding plate is placed on the straight line from the cluster ion source to the substrate stage to prevent neutral particles from flowing toward the substrate stage, and only the cluster ions having a predetermined number of atoms are attached to the substrate crystal. Therefore, the variations in GaAs box size due to the neutral particles can be prevented and the variations in quantum effect can be reduced.

What is claimed is:

1. A method for producing a box type quantum well structure comprising:
   placing a substrate on a substrate stage; and
   attaching cluster ions generated by a cluster ion source to the surface of said substrate to produce a box type quantum well structure including:
   linearly accelerating ion clusters generated and ionized by said cluster ion source with an electric field;
   passing said accelerated cluster ions through a second field to apply a force perpendicular to the linear acceleration to cause the respective cluster ions to follow different ion orbits in accordance with the number of atoms of the respective cluster ions;
   arranging said substrate to intersect the orbit of cluster ions having a predetermined number of atoms; and
   intercepting said cluster ions having a predetermined number of atoms with said substrate so that said cluster ions attach to said substrate.

2. A method for producing a box type quantum well structure as defined in claim 1 including passing said cluster ions through a magnetic field as said second field.

3. A method for producing a box type quantum well structure as defined in claim 1 including passing said cluster ions through an electric field as said second field.

4. A method for producing a box type quantum well structure as defined in claim 1 including rotationally adjusting said substrate to have a preselected angle relative to the orbit of said cluster ions having a predetermined number of atoms.

5. A method for producing a box type quantum well structure as defined in claim 1 including shielding said substrate from neutral particles with a shielding plate disposed along a straight line between said substrate and said cluster ion source to prevent the neutral particles from flowing toward said substrate.

6. A method for producing a box type quantum well structure comprising:
   placing a substrate on a substrate stage; and attaching cluster ions generated by a cluster ion source to the surface of said substrate to produce a box type quantum well structure including:

linearly accelerating ion clusters generated and ionized by said cluster ion source with an electric field;

passing said accelerated cluster ions through a second field to apply a force perpendicular to the linear acceleration to cause the respective cluster ions to follow different ion orbits in accordance with the number of atoms of the respective cluster ions;

arranging said substrate to intersect the orbit of cluster ions having a predetermined number of atoms;

shielding said substrate from neutral particles with a neutral particle shielding plate disposed along a straight line between said substrate and said cluster ion source to prevent the neutral particles from flowing toward said substrate; and intercepting said cluster ions having a predetermined number of atoms with said substrate so that said cluster ions attach to said substrate.

7. A method for producing a box type quantum well structure as defined in claim 1 including passing said cluster ions through a magnetic field as said second field.

8. A method for producing a box type quantum well structure as defined in claim 6 including passing said cluster ions through an electric field as said second field.

9. A method for producing a box type quantum well structure as defined in claim 6 including arranging said substrate to have a predetermined angle orbit of said cluster ions having a predetermined number of atoms.

10. A method for producing a box type quantum well structure as defined in claim 6 including rotating said substrate to adjust the substrate to have a predetermined angle with respect to the orbit of said cluster ions having a predetermined number of atoms.

* * * * *